United States Patent
Di Stefano

(10) Patent No.: US 7,837,476 B2
(45) Date of Patent: *Nov. 23, 2010

(54) MINIATURE ELECTRICAL BALL AND TUBE SOCKET ASSEMBLY WITH SELF-CAPTURING MULTIPLE-CONTACT-POINT COUPLING

(75) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/539,475

(22) Filed: Aug. 11, 2009

(65) Prior Publication Data

US 2009/0305523 A1    Dec. 10, 2009

Related U.S. Application Data

(60) Continuation of application No. 12/246,267, filed on Oct. 6, 2008, now Pat. No. 7,674,113, which is a division of application No. 11/893,979, filed on Aug. 17, 2007, now Pat. No. 7,442,045.

(51) Int. Cl.
*H01R 12/00* (2006.01)
(52) U.S. Cl. .............................. 439/66; 439/74; 439/81; 439/841
(58) Field of Classification Search ................. 439/66, 439/74, 81, 841
See application file for complete search history.

(56) References Cited

U.S. PATENT DOCUMENTS

| | | | |
|---|---|---|---|
| 3,286,671 A | 11/1966 | Fuller | |
| 3,314,044 A | 4/1967 | Powell | |
| 3,676,838 A | 7/1972 | Hartz et al. | |
| 3,783,433 A | 1/1974 | Kurtz et al. | |
| 4,531,807 A | 7/1985 | Trigon | |
| 4,560,223 A | 12/1985 | Cooney et al. | |
| 4,881,639 A | 11/1989 | Matsuoka et al. | |
| 4,897,040 A | 1/1990 | Gerke et al. | |
| 4,899,099 A | 2/1990 | Mendenhall et al. | |
| 4,961,709 A | 10/1990 | Noschese | |
| 4,968,931 A | 11/1990 | Littlebury et al. | |
| 4,975,638 A | 12/1990 | Evans et al. | |
| 5,009,613 A | 4/1991 | Langgard et al. | |
| 5,020,219 A | 6/1991 | Leedy | |
| 5,032,787 A | 7/1991 | Johnston et al. | |
| 5,073,122 A | 12/1991 | Burke, Jr. | |
| 5,082,462 A | 1/1992 | Oswald, Jr. | |
| 5,103,976 A | 4/1992 | Murphy | |

(Continued)

OTHER PUBLICATIONS

International Search Report of the International Searching Authority for Application No. PCT/US2007/061836, mailed on Feb. 22, 2008, 11 pages.

(Continued)

*Primary Examiner*—Gary F. Paumen
(74) *Attorney, Agent, or Firm*—Townsend and Townsend and Crew LLP; Kenneth R. Allen

(57) ABSTRACT

A socket assembly formed of hollow tubes for connecting an array of terminals off opposing electronic structures with both axial and lateral resilience, wherein the resilience is achieved through angular cuts in the tubes.

12 Claims, 5 Drawing Sheets

U.S. PATENT DOCUMENTS

| | | | |
|---|---|---|---|
| 5,135,403 | A | 8/1992 | Rinaldi |
| 5,295,862 | A | 3/1994 | Mosquera |
| 5,336,992 | A | 8/1994 | Saito et al. |
| 5,339,027 | A | 8/1994 | Woith et al. |
| 5,366,380 | A | 11/1994 | Reymond |
| 5,383,913 | A | 1/1995 | Schiff |
| 5,391,995 | A | 2/1995 | Johnston et al. |
| 5,439,393 | A | 8/1995 | Watson |
| 5,479,109 | A | 12/1995 | Lau et al. |
| 5,518,410 | A | 5/1996 | Masami |
| D372,222 | S | 7/1996 | Matthews |
| 5,554,048 | A | 9/1996 | Martins |
| 5,633,597 | A | 5/1997 | Stowers et al. |
| 5,669,774 | A | 9/1997 | Grabbe |
| 5,682,064 | A | 10/1997 | Atkins et al. |
| D387,729 | S | 12/1997 | Huska |
| 5,791,914 | A | 8/1998 | Loranger et al. |
| 5,798,565 | A | 8/1998 | Atkins et al. |
| 5,812,378 | A | 9/1998 | Fjelstad et al. |
| 5,841,291 | A | 11/1998 | Liu et al. |
| 5,863,813 | A | 1/1999 | Dando |
| 5,887,344 | A | 3/1999 | Sinclair |
| 5,928,000 | A | 7/1999 | Rudisill et al. |
| 5,936,421 | A | 8/1999 | Stowers et al. |
| 5,949,246 | A | 9/1999 | Frankeny et al. |
| 5,957,293 | A | 9/1999 | Pakeriasamy |
| 5,960,961 | A | 10/1999 | Gutentag |
| 5,982,187 | A | 11/1999 | Tarzwell |
| 5,984,694 | A | 11/1999 | Sinclair |
| RE36,442 | E | 12/1999 | Kardos |
| 6,007,349 | A | 12/1999 | Di Stefano et al. |
| 6,021,904 | A | 2/2000 | Kozol et al. |
| 6,034,532 | A | 3/2000 | Tarzwell |
| 6,060,891 | A | 5/2000 | Hembree et al. |
| 6,064,217 | A | 5/2000 | Smith |
| 6,069,482 | A | 5/2000 | Hilton |
| 6,159,056 | A | 12/2000 | Boyle |
| 6,179,127 | B1 | 1/2001 | Kato et al. |
| 6,193,524 | B1 | 2/2001 | Chang |
| 6,227,372 | B1 | 5/2001 | Thomas et al. |
| 6,264,476 | B1 | 7/2001 | Li et al. |
| 6,271,674 | B1 | 8/2001 | Hasegawa et al. |
| 6,275,051 | B1 | 8/2001 | Bachelder et al. |
| 6,275,052 | B1 | 8/2001 | Hembree et al. |
| 6,296,122 | B1 | 10/2001 | Nakazono et al. |
| 6,330,744 | B1 | 12/2001 | Doherty et al. |
| 6,341,962 | B1 | 1/2002 | Sinclair |
| 6,377,059 | B2 | 4/2002 | Vinther et al. |
| 6,444,913 | B1 | 9/2002 | Kao |
| 6,705,876 | B2 | 3/2004 | Eldridge |
| 6,712,621 | B2 | 3/2004 | Li et al. |
| 6,720,511 | B2 | 4/2004 | Windebank |
| 6,722,893 | B2 | 4/2004 | Li et al. |
| 6,731,123 | B2 | 5/2004 | Kimoto |
| 6,750,669 | B2 | 6/2004 | Holcombe |
| 6,776,668 | B1 | 8/2004 | Scyoc et al. |
| 6,784,678 | B2 | 8/2004 | Pietzschmann |
| D496,339 | S | 9/2004 | Stanley |
| 6,845,375 | B1 | 1/2005 | Sinclair |
| 6,846,184 | B2 | 1/2005 | Fan et al. |
| 6,857,524 | B2 | 2/2005 | Duban-Hu et al. |
| 6,873,168 | B2 | 3/2005 | Kazama |
| 6,911,835 | B2 | 6/2005 | Chraft et al. |
| 6,945,827 | B2 | 9/2005 | Grube et al. |
| 6,974,332 | B2 | 12/2005 | Ma |
| 7,008,251 | B2 | 3/2006 | Ripper et al. |
| 7,014,473 | B2 | 3/2006 | Millard et al. |
| 7,029,288 | B2 | 4/2006 | Li |
| D522,471 | S | 6/2006 | Sisson |
| 7,164,951 | B2 | 1/2007 | Ries et al. |
| 7,230,438 | B2 | 6/2007 | Crippen |
| 7,382,143 | B2 | 6/2008 | Di Stefano |
| 7,393,214 | B2 | 7/2008 | Di Stefano |
| 7,442,045 | B1 | 10/2008 | Di Stefano |
| 7,445,001 | B2 | 11/2008 | Sikora |
| 7,491,069 | B1 | 2/2009 | Di Stefano et al. |
| D589,010 | S | 3/2009 | Di Stefano |
| D589,011 | S | 3/2009 | Di Stefano |
| D595,650 | S | 7/2009 | Di Stefano |
| D595,651 | S | 7/2009 | Di Stefano |
| D595,652 | S | 7/2009 | Di Stefano |
| D595,653 | S | 7/2009 | Di Stefano |
| 7,559,769 | B2 | 7/2009 | Hsiao et al. |
| 2002/0162770 | A1 | 11/2002 | Chang |
| 2003/0137316 | A1 | 7/2003 | Kazama |
| 2004/0106327 | A1 | 6/2004 | Baker |
| 2005/0073041 | A1 | 4/2005 | Canella |
| 2005/0088193 | A1 | 4/2005 | Haga |
| 2005/0277306 | A1 | 12/2005 | Millard et al. |
| 2006/0071656 | A1 | 4/2006 | Joung et al. |
| 2007/0269999 | A1 | 11/2007 | Di Stefano |
| 2008/0176416 | A1 | 7/2008 | Hougham et al. |
| 2008/0194124 | A1 | 8/2008 | Di Stefano |
| 2008/0311768 | A1 | 12/2008 | Hougham et al. |
| 2009/0023311 | A1 | 1/2009 | Goodman |
| 2009/0068858 | A1 | 3/2009 | Di Stefano |
| 2009/0081891 | A1 | 3/2009 | Hougham et al. |
| 2009/0305523 | A1* | 12/2009 | Di Stefano .................. 439/66 |
| 2010/0022105 | A1* | 1/2010 | Di Stefano .................. 439/66 |

OTHER PUBLICATIONS

International Search Report of the International Searching Authority for Application No. PCT/US2008/071496, mailed on Nov. 3, 2008, 7 pages.

Requirement for Restriction/Election for U.S. Appl. No. 12/246,267, mailed on May 5, 2009, 5 pages.

Non-Final Office Action for U.S. Appl. No. 12/246,267, mailed on Sep. 4, 2009, 8 pages.

* cited by examiner

*FIG. 1A*
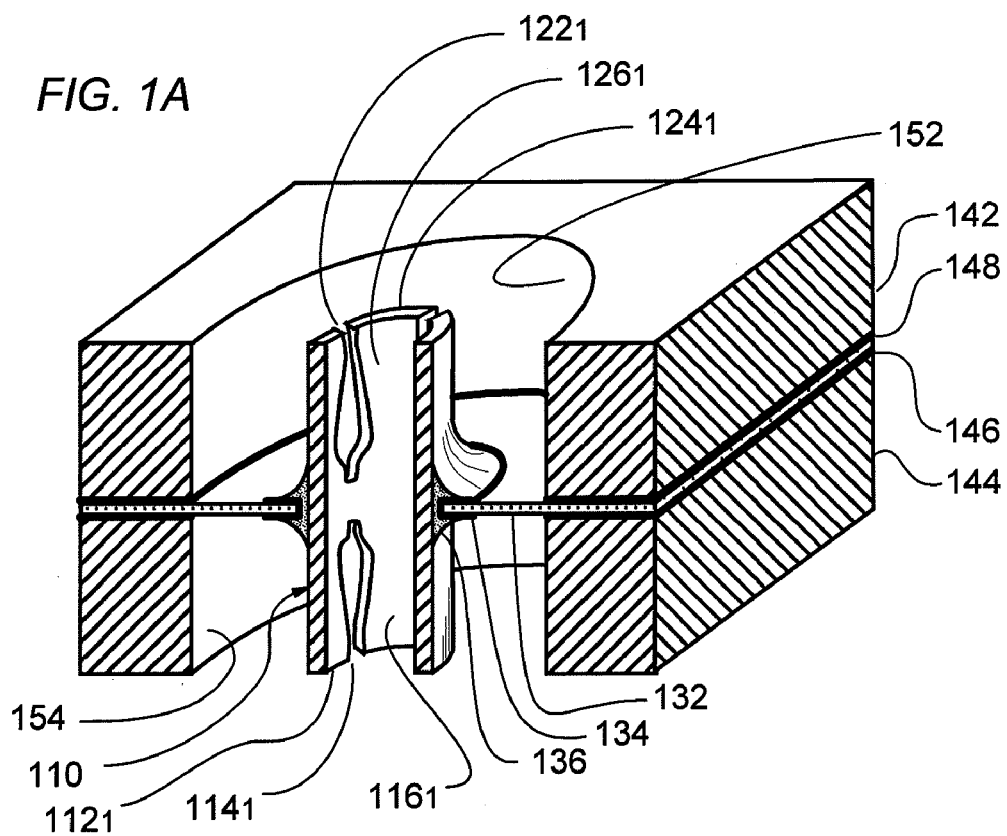
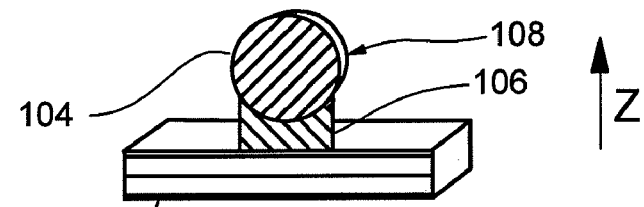
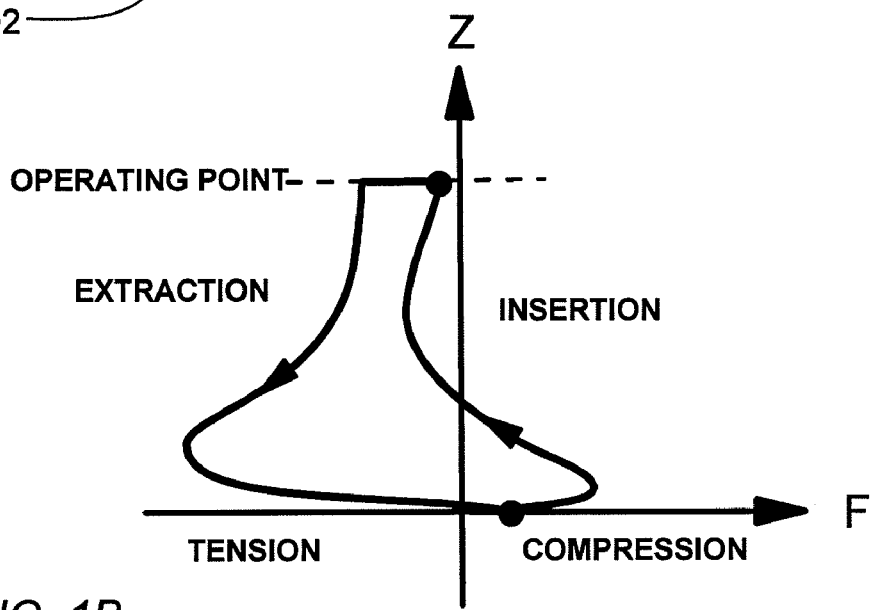
*FIG. 1B*

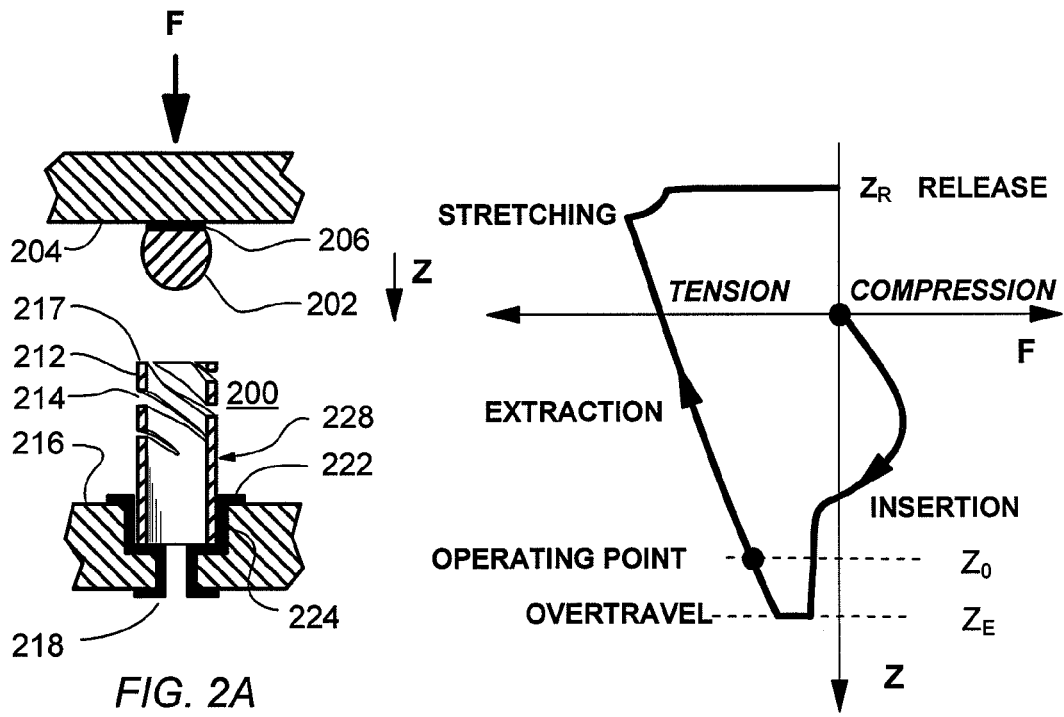
FIG. 2A
FIG. 2D
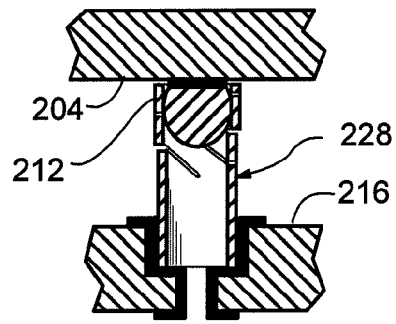
FIG. 2B
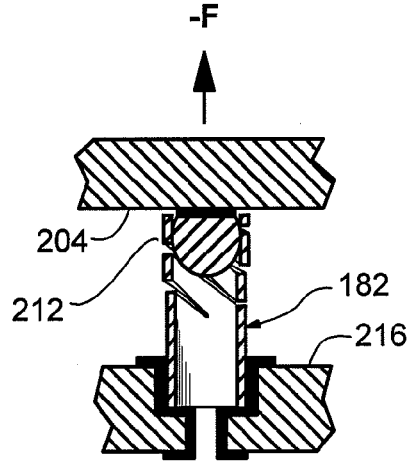
FIG. 2C

MINIATURE ELECTRICAL BALL AND TUBE SOCKET ASSEMBLY WITH SELF-CAPTURING MULTIPLE-CONTACT-POINT COUPLING

CROSS-REFERENCES TO RELATED APPLICATIONS

The present application is a continuation of U.S. application Ser. No. 12/246,267, filed on Oct. 6, 2008, entitled "Miniature Electrical Ball And Tube Socket Assembly With Self-Capturing Multiple-Contact-Point Coupling," which is a division of U.S. application Ser. No. 11/893,979, filed on Aug. 17, 2009, now U.S. Pat. No. 7,442,045, entitled "Miniature Electrical Ball And Tube Socket With Self-Capturing Multiple-Contact-Point Coupling," the content of which is incorporated herein by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to miniature electrical connectors, as for example ball grid array (BGA) connectors, including connectors having pin dimensions of less than 1 millimeter in diameter and pin pitches of less than two millimeters. One or more embodiments of the present invention relate to a high performance electrical connector, that is a connector for supplying high current (relative to connectors of comparable size) and high frequency (RF) signals to high performance microelectronic devices, for example, and without limitation, integrated circuits ("ICs"), including microprocessors, chips for peripheral functions and RAM memories.

Connectors are used widely in electronics to interconnect microelectronic devices such as semiconductor integrated circuits ("ICs"), printed wiring boards, system boards, backplanes and cable of various sorts. A socket is a type of connector used to connect terminals on an electronic device to corresponding contacts on a printed circuit board or other electrical interconnection means. It is often an array of female-type elements intended to engage male-type elements of a plug array. In addition, sockets are routinely used in systems for: (a) testing electronic device performance (an assortment of socket types have been developed to connect to a device under test ("DUT") having a wide variety of terminals and configurations), or (b) burn-in of electronic devices at elevated temperatures. A cable connector is another type of connector that is typically used to connect an array of terminals on an electrical cable to a group of parallel electrical wired or other conductors. Backplane connectors and inter-board connectors are further types connectors used to connect an array of terminals on one printed wiring board to a corresponding array of terminals on another printed wiring board.

Prior art connectors are differentiated typically according to contactor type and intended end use (i.e., application). As such, connectors used in application in sockets are typically designed to make electrical contact to microelectronic devices having specific types of device terminals—types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads ("LAN" grid arrays or "LGAs"), and many others. In order to provide sockets for microelectronic devices with this variety of terminals, many contactor technologies have been developed for sockets. In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low cost prior art sockets for burn-in and product applications typically incorporate contactors of stamped and formed springs to contact terminals on a DUT. In still further addition to the foregoing, for high pin-count prior art sockets, a cam is often used to urge device terminals laterally against corresponding contactors to make good contact to each spring while allowing a low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel connectors, and spring forks, among others. Prior art sockets intended for applications where many test mating cycles (also referred to as socket mount-demount cycles) are required typically use spring pin contactors of the type exemplified by Pogo® spring contacts (available from Everett Charles Technologies of Pomona, Calif.). Spring probes for applications in the electronics test industry are available in many configurations, including simple pins and coaxially grounded pins. Most prior art spring probes consist of a helical wire spring disposed between a top post (for contacting terminals on the DUT) and a bottom post (for contacting contacts on a circuit board—a device under test board or "DUT board").

Prior art sockets typically have a plurality of contactors disposed in an array of apertures formed through a dielectric holder. By way of example, a high performance, prior art test socket may incorporate a plurality of Pogo® spring contacts, each of which is held in a pin holder with an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. The individual Pogo® spring contacts are typically selected and designed for signal conduction at an impedance level of approximately fifty (50) ohms. In certain high performance, prior art configurations, the contactor is a coaxial type having a center spring pin with a contactor barrel body enclosed within a cylindrical, coaxial, ground shield spaced to achieve a desired signal impedance, typically fifty (50) ohms.

Connectors used in applications for connecting one printed wiring board to another printed wiring board can be classified by type including edge connectors, pin-in-barrel connectors, stamped spring connectors, spring fork connectors, LAN-grid array connectors, conductive elastomeric connectors, and various types known in the art.

Cable connectors adapted to flat cables are generally similar to printed wiring board to printed wiring board connectors with the added feature that one side of the connection is made to a flex cable or a flat array of wires rather than to a printed wiring board. Cable connectors adapted to a round bundle of wires are generally of the type employing a pin in barrel wherein a spring in the barrel retains the pin and applies a lateral force on the pin to establish reliable electrical contact. The spring incorporated into the barrel element may be a spring insert, a bundle of spring wires or an integral spring in the barrel.

The class of connectors used for socketing ICs is specialized and important in the electronics industry. The recent growth in use of BGA terminals for IC packaging has resulted in use of new and varied sockets adapted to BGA terminals for increasing terminal count and area density. BGA sockets have evolved in several directions. One type involves use of a cam driven spring wire to contact the side of each ball. Spring pins or Pogo® pins have been adapted to use in BGA sockets for certain applications in which the high cost of the socket is acceptable.

Low-cost BGA sockets for mass market applications have evolved the use of stamped and formed springs that cradle each ball of the BGA and provide some measure of mechanical compliance needed to urge a spring connector into contact with a mating ball. Variations of stamped and formed springs are configured to use two or more formed springs to grip each ball and thereby make positive electrical contact while retaining the ball mechanically. Miniaturization and density of the mechanically stamped and formed springs are limited by present capabilities to a certain size. Although advances continue to be made in the manufacturing art of stamping and forming springs, sockets with contactors so made are limited in density by the complexity of stamping and forming vary small miniaturized springs. Further, the mechanical compliance of a stamped and formed spring is typically small in a vertical direction perpendicular to a substrate of a ball. Because of small compliance in a vertical direction, a miniature stamped and formed spring may be unable to accommodate motion of a contactor support relative to a ball mated to it, thereby allowing vibration, mechanical shock load and forces, flexure, and the like to cause the connector to slide over the surface of the ball. It is known in the industry that repeated microscopic motion of one contact relative to a mating contact causes fritting or a build up of small particle debris that can lead to contact failure.

Stamped and formed spring contacts are typically held in an array of shaped holes through in a molded plastic housing to form a connector assembly. As connector assemblies are miniaturized, the molding and assembly process are increasingly difficult and costly, thereby limiting the extension of connectors based on formed spring contacts to very high densities.

BGA sockets have also been constructed with contactors that make electrical contact to a bottom region of a ball by means of bundles of helical wires, wires in elastomer material, cantilever springs, lithographically formed flat springs and other contactors that apply force vertically to a mating ball. The vertical force is necessary to make a good connection between a ball of a BGA and such contactor is significant for BGA packages with a large number of balls or bumps. For example, the clamping force for a BGA socket that applies force vertically to 1200 contact bumps is as high as 30 Kg, as needed to achieve adequate contact to each of the contact bumps. The clamping force needed by BGA sockets that make contact by applying force vertically is an increasing problem as the number of contact bumps increases into the thousands.

As is well known to those of ordinary skill in the art, a primary function of prior art connectors is to provide reliable and repeatable electrical contact to electrical terminals without causing damage to either. Further, a connector must provide a low resistance connection over a product lifetime that involves repeated temperature cycles, mechanical shock, vibration and flexure. As such, contact resistance is one measure of reliability of a connector as determined as a function of a number of temperature cycles, a number of drops, a number of flexures and a G-force level of vibration. As connectors are miniaturized, improvements in reliability are needed to meet the requirements of future electronic systems.

Advances in the density and speed of electronic devices are placing additional demands on connectors. In particular, a continuing increase in the wiring density of electronic systems requires a corresponding advance in the density of connectors as determined by the number of contacts per unit area. Further, at higher frequencies and clock speeds, the size and the self inductance of connectors are becoming an important limitation to system performance. In addition to a lower inductance, advances in impedance control and shielding are required for future electronic systems.

In light of the above, despite the many connector technologies available in the prior art, there is a need in the art for a connector that can satisfy one or more of the above-identified demands relating to smaller size, higher density and higher performance.

The following is a listing of patents believed to be relevant to the present invention.

U.S. Pat. No. 3,676,838, which is believed to be the most relevant patent to the present invention, discloses a clamp-type connector having U-shaped elements in a socket intended to grip ball-like pins of a plug. Despite being of a substantially larger scale than the present invention, the structure of the gripping mechanism, particularly as represented by FIGS. 5 and 6, rely on a pair of detents in opposing expandable grips of the receiving socket. Unlike the present invention, the gripping mechanism does not tend to tighten only upon attempted withdrawal of the pin but relies on the boundaries of the detent to maintain position in the socket. If the detents and balls are of non-matching or of non-uniform size, looseness, non-uniform gripping force and loss of gripping ability may result.

U.S. Pat. No. 5,887,344 is another example of a ball pin fitting into detents of a gripping socket. Folded wings are intended to grip a ball-like tip. The invention therein disclosed features many of the same characteristics of the '838 patent.

U.S. Pat. No. Re. 36,442 illustrates an adapter for emulating a ball grid array type package. Pitch dimensions are equal to or greater than 1 mm and holes may be on the order of 300 microns. There is no evident provision for gripping pins upon attempted withdrawal.

U.S. Pat. No. 5,669,774 illustrates a ball grid array with sockets that have mounted therein petal-like tines to grip balls of the ball array and in that sense is similar to the 838 patent.

U.S. Pat. No. 5,518,410 illustrates a ball to ring contact where the socket contactor element is rotated by a cam upon socketing.

U.S. Pat. No. 6,264,476 illustrates a wire segment based interposer with coaxially shielded socket elements, where the wires, if resilient and in some configurations may have a gripping function, around an insulative core, as for example FIG. 2 and FIG. 3b, but evidently none is disclosed or suggested.

U.S. Pat. No. 6,846,184 discloses various types of contacts composed of springs that impinge but do not grip confronting contact buttons. This type of contact should not be confused with a ball gripping array socket.

Various other ball grid array connectors, banana plugs with split ferrules, interposers, pin arrays and the like are known but are believed to be no more relevant than the illustrative patents.

SUMMARY OF THE INVENTION

According to the invention, a socket assembly for connecting an array of bulbous terminals such as balls wherein the female element is a miniature tube that has resilient prongs that grip the corresponding terminals with varying force during insertion and deletion. The tube is of resilient conductive material that has been sliced or helically partitioned into opposing prongs forming slots of a width that increases with axial distance from the end of the tube so as to allow the prongs of the connector to grip around the ball-like bulbous terminal and mechanically retain the terminal within the connector. The tubular element of the connector may be made by forming prongs in one or both ends of a tube by cuts of a width that increases with distance from the end of the tube. More particularly, the female element comprises a tube of resilient conductive material that has been sliced or partitioned into prongs of a width that is variable with distance along the axis of the tube so as to allow the prongs of the connector to deflect radially away from the axis and to capture within the tube a bulbous terminal thereby mechanically gripping the contact bulb as the bulb is inserted along the longitudinal axis of the tube. The radial deflection of the prongs varies as the contact bulb moves along the axis. The prongs of the connector tube make effective electrical contact at several locations around the circumference of the bulb. The tubular element according to some embodiments is made by forming resilient helical prongs in the end of a tube in at least two helical cuts of varying width (forming opposing prongs) through the tube from one end of the tube to a mid section of the tube, such that the width of the cut increases with distance away from the end of the tube.

The female prongs of the connector according to the invention preferably are able to grip a ball around its maximum circumference so as to retain the ball within the tube. By fabricating shaped prongs of varying width on an end of a straight-walled cylindrical metal tube by means of laser cutting techniques, a miniature connector may be made that is able to socket a ball as small a flip chip bump, i.e., on the order of 100 microns diameter. The connector according to embodiments of the invention is able hold a ball within resilient prongs by means of a retaining force to make good electrical contact notwithstanding vibration and mechanical stress. By shaping the prongs to have a circumferential width that decreases with distance away from the end of the tube, the extraction force needed to withdraw a bulbous terminal from the tube may be significantly greater than the insertion force. According to one or more embodiments of the invention, the extraction force is at least 150% of the insertion force for a bulbous terminal in a tubular connector.

Numerous benefits are achieved using the present invention over conventional connectors. For example, an embodiment of the present invention provides a means for contacting a dense array of bumps, such as solder balls, with a connector that is only slightly larger than the ball and therefore bumps can be more densely spaced than in the prior art. For example, a connector made by laser cutting a thin wall stainless steel tube can be made with an outside diameter only 50 microns larger than the diameter of the ball, allowing the spacing between connectors to be very small in order to form a high density array of connectors.

A further advantage of the present invention is provided by a tubular connector with shaped prongs on a first end that engage a first ball and helical prongs on a second and opposing end that engage a second ball, whereby the prongs of the first end resiliently pull the first ball toward the second ball. This advantage enables use of an array of such connectors to attach an electronic device to a substrate without need for a mechanical retaining component to apply force urging the device toward the substrate.

Another advantage of the present invention is provided by a tubular connector with shaped prongs on a first end that engage a first ball and shaped prongs on a second end that engage a second ball such that the first ball is relatively free to move with respect to the second ball in a plane perpendicular to the axis of the tubular connector. This motion offers advantages in relieving mechanical stress due to thermal expansion mismatch, shock, vibration, and other mechanical motion.

Yet another advantage is provided by the present invention embodied in a connector that has a low self inductance. Thin laser-cut grooves through the tube allow less magnetic flux penetration into the interior of the tube than a connector made of a helical wire spring. The self inductance of the connector of the present invention may be further reduced by making the helical prongs short, as they extend a small distance from a solid girth around the tubular connector. These and other aspects of the present invention allow a high performance connector.

Depending upon the embodiment, one or more of these benefits may exist. These and other benefits have been described throughout the present specification and more particularly below.

Various additional objects, features, and advantages of the present invention can be more fully appreciated with reference to the detailed description and accompanying drawings that follow.

BRIEF DESCRIPTION OF THE DRAWINGS

FIG. 1A is a perspective sectional view of a tubular connector and bulbous terminal of a tube socket according to the invention with prongs that are adapted to gripping a bulbous terminal post slightly larger maximum outer diameter than the inner diameter of the tubular connector.

FIG. 1B is a graphical representation of the vertical force in a Z-direction needed for insertion and extraction of a bulbous terminal into the tubular connector of FIG. 1A.

FIGS. 2A to 2C are tubular connectors with helical prongs according to the invention for making connection to a corresponding bulbous terminal.

FIG. 2D is a graphical representation of the vertical force needed for insertion and for extraction of a bulbous terminal into the tubular connectors of FIGS. 2A-2C.

FIGS. 4A and 4B are cross-sectional views of an embodiment of a ball and tube socket according to the invention, wherein FIG. 4A shows the tubular connectors of the socket in vertical alignment and FIG. 4B shows the tubular connectors of the socket to be tilted.

DETAILED DESCRIPTION OF THE INVENTION

Figure 3A:
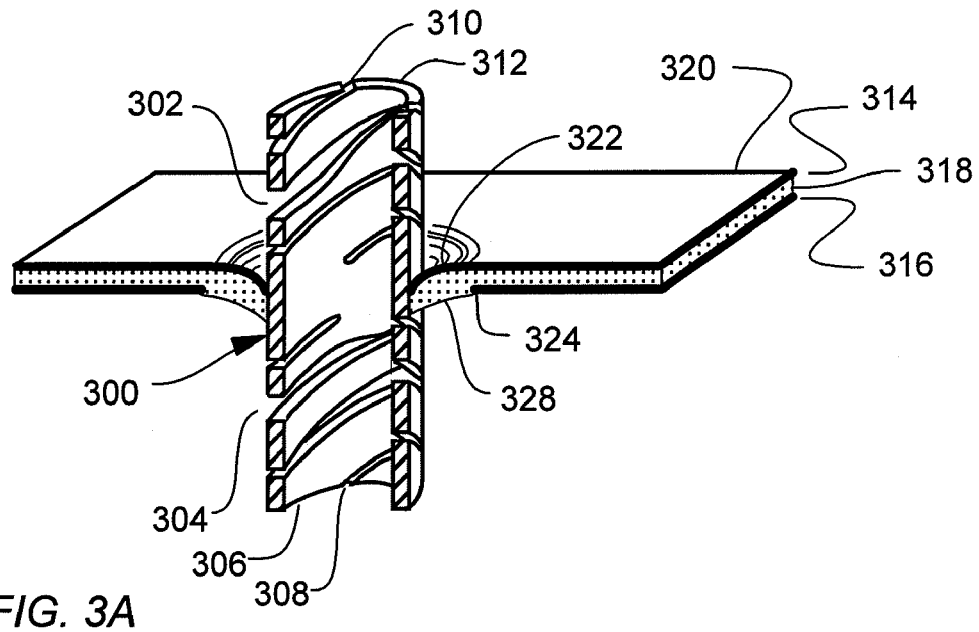
FIG. 3A is a partial sectional view of a double ended tubular connector with shaped helical prongs adapted to mating with bulbous terminals.

According to the invention, a high performance connector is provided for making reliable electrical connection to miniature and typically closely spaced terminals on an electronic device. More particularly, embodiments of the present invention provide a straight walled cylindrical metal tube that is cut in a pattern of slots of varying width into several prongs that are adapted to contact a bulbous terminal post around its circumference and to provide electrical contact thereto.

As illustrated in FIG. 1A, tubular connector 110 comprises a hollow cylindrical metal tube which is cut through on a bottom end by four slots $114_1$ to $114_4$ of variable width to form in this instance four prongs $116_1$ to $116_4$ terminated in four tips $112_1$ to $112_4$. For clarity of exposition, only one of each of the slots, prongs and tips is labeled in FIG. 1A. Prongs $116_1$ to $116_4$ are held in place by cylindrical collar region 120 in the un-sliced portion of the tube. The prongs are adapted to grip a bulbous terminal 108 inserted along the axis of tubular connector 110. The bulbous terminals preferably have a ball tip 104 attached to a wiring substrate 102 by a metal collar 106. However, a cylindrical or frustoconical tip having an outer diameter in the mating region that is slightly greater than the inner diameter of the tube is also believed to be within the reasonable spirit and scope of embodiments of the invention.

In accordance with one or more preferred embodiments, tubular connector 110 is made from hypodermic tubing of Type 304 stainless steel having an inner diameter of 440 microns and outer diameter of 550 microns. Such stock material is available from K-Tube Corporation of Poway, Calif. Four slots $114_1$ to $114_4$ of variable width are made by cutting along the length of the tube using for example a Nd-YAG laser. Slots $114_1$ to $114_4$ are typically cut to a width that increases with distance from tips $112_1$ to $112_4$ over at least a portion of the axial length of tubular connector 110. Slots $114_1$ to $114_4$ of embodiment 110 have a width of about 0.050 mm at the bottom distal end, and a maximum width of 0.25 mm at a distance of 0.35 mm from the bottom distal end.

After laser cutting, the hypodermic tube is plated with a 4 micron thick layer of nickel and a 1.5 micron thick layer of soft gold to form a highly conductive surface for contacting a mating bulbous terminal. The steel core provides sufficient resilience to grip a terminal while the tube 110 is expanded to accommodate bulbous terminals inserted along its longitudinal axis. The tubular connector of FIG. 1A is intended to connect electrically and to grip mechanically a 480 micron diameter metal ball 104 and to retain the ball within the tubular connector at an operating point. The upstream side of the ball, being of a smaller diameter is subjected to less retaining force than the equatorial or maximum outer diameter of the ball. Thus, if the ball is attempted to be withdrawn, the force from the prongs on the ball increases, particularly as the prongs are urged outward from the tube axis, thereby offering enhanced resistance to withdrawal. In a specific embodiment, as for example in FIG. 1A, ball 104 is a steel ball plated with a flash coating of nickel and a coating of 2 micron thick soft gold. A force of 10 gf is sufficient to insert the 0.48 mm diameter metal ball into the contactor tube and to provide a contact resistance of about 0.018 ohms. Once engaged, the ball 110 may be held in place by the contactor without need of a clamp or other mechanical holder. A force of about 50 gf is needed to extract the bulbous terminal from the tubular connector.

When fully inserted into tubular connector 110, bulbous terminal 108 contacts prongs $116_1$ to $116_4$ at an operating point about 0.300 mm from the bottom distal end of connector 110. During insertion, prongs $116_1$ to $116_4$ are first urged outward away from the axis of the tube. As the terminal progresses along the axis of the tube, prongs $116_1$ to $116_4$ relax inwardly toward the axis of the tube, thereby holding ball 104 of terminal 108 inward and away from the bottom distal end of tubular connector 110. The force F exerted upon ball 104 by prongs $116_1$ to $116_4$ of the tubular connector is shown in FIG. 1B as a function of position Z along the axis of the connector. Initially a compressive force acts to push the ball downward as the ball is inserted into the bottom distal end of connector 110. As ball 104 moves in a direction Z along the axis of connector 110, the force exerted on ball 104 by prongs $116_1$-$116_4$ is in tension, pulling ball 104 upward into the connector. At an operating point, ball 104 of the bulbous terminal is fully inserted into connector 110, and held upward by a force due to the relaxation of prongs $116_1$ to $116_4$ inward toward the axis of the connector as the ball moves upward. Upon extraction of ball 104 from connector 110, a frictional force is added to the static force resisting the downward motion of ball 104, putting the bulbous terminal in tension as it is moved out of connector 110. According to one or more embodiments of the invention, a bulbous terminal is retained and held by an inwardly directed force within a cylindrical tubular connector. The retention force is determined by the shape of slots in the cylindrical tube rather than by non-cylindrical features, tabs, springs and the like.

Although the embodiment of FIG. 1A shows four prongs $116_1$ to $116_4$ on the bottom of tubular connector 110, it will be evident to one of skill in the art that the contactor may incorporate any plurality of prongs of two or greater as necessary to grip a bulbous terminal around its circumference with balanced radial forces. This is to be distinguished from the alternative of a tightly-packed coil spring, where the end would correspond to a single prong and thus not be able to offer the gripping leverage of opposing prongs at the end of the tubular structure.

The thickness of the tubing material of the connector 110 is selected to supply a required insertion force for insertion of a post into the connector, and is preferably between 2% and 20% of the inner diameter of the tube. The thickness and material of the cylindrical tube may vary depending upon requirements of the application. For example, the material may be selected from a group without limitation including stainless steel of various types, tempered steels, beryllium copper, phosphor bronze, copper alloys of various types, nickel tungsten alloys, nickel chromium alloys, nickel manganese alloys, nickel binary and ternary alloys, titanium alloys, and even nitinol-type alloys. (Nitinol is an acronym for Nickel Titanium Naval Ordnance Laboratory and refers to a family of intermetallic materials which contain a nearly equal mixture of nickel and titanium and other spring materials and which exhibit temperature sensitive spring properties including shape memory and superelasticity.) The connector may be plated with copper, nickel, cobalt, palladium, gold, and alloys thereof, as well as other conductive films. A high strength conductive film coating on the tube, for example and without limitation including Ni—W alloys, Ni—Co alloys, Ni—Cr alloys, Ni—Mn alloys, Ni—V alloys and combinations thereof, may be used to further strengthen the material of the tube. In further embodiments, a connector lubricant may be applied to the surface of the prongs of the connector to reduce fritting and improve lifetime of the connector.

In addition, the high performance connector of the invention may be fabricated by means including but not limited to; laser cutting of tubular material, plasma etching of tubular material, pattern etching of tubular material, pattern plating of tubular material, layer plating of tubular material, LIGA plating, and combinations thereof. The tubing of the connector is typically a straight walled cylinder of circular cross section, although oblong, square, or polygonal cross section tubes are also within contemplation of the invention. For example, the tube may be a cylindrical tube of circular cross section that has been flattened on four sides. Laser annealing, flash annealing, ion beam treatment, pickling, quenching, heat treating and other treatments known in the art may be used to improve properties of the spring material of the connector.

Further advantages accrue in embodiments of the invention in which a double-ended connector is provided in which each of the two ends are interchangeable or otherwise equivalent. FIG. 1A is an embodiment of the present connector in which a bottom end is equivalent to the top end in that the mechanical force needed to mate the top end of the connector to a specified terminal post is substantially the same as the mechanical force needed to mate the bottom end to the specified terminal post. Equivalence of the two ends may be achieved by cutting a pattern through the bottom end of a tube that is a mirror image of the pattern cut through the top end of the tube. The pattern may be mirrored by a plane perpendicular to the axis of the tube as in FIG. 1A. Prongs $126_1$ to $126_4$ formed by slots $122_1$ to $122_4$ at the top end of the tubular connector 110 are a mirror image of prongs $116_1$ to $116_4$ formed by slots $114_1$ to $114_4$ at the bottom end. Prong tips $124_1$ to $124_4$ at the top end of connector 110 are correspondingly mirror images of probe tips $112_1$-$112_4$ at the bottom end of the connector. Alternatively, the pattern of slots may be mirrored around a point on the axis of the tube. Additionally, the bottom pattern may be rotated about the axis with respect to the top pattern without substantially changing equivalence of the operation of the top and the bottom pattern.

Double-ended connector of FIG. 1A offers significant manufacturing advantages in the assembly of such connectors into arrays. Individual connectors may be inserted into an array of holes in a carrier sheet by automated equipment without the need for examining and orienting the connector in either an up or down configuration. In this embodiment, a variety of double-ended connector shapes provide equivalent mating forces to a bump. Although a double-ended connector with equivalent ends provides advantages in simplifying manufacturing assembly, one skilled in the art will appreciate that a double-ended connector of this invention need not have ends that are mechanically equivalent. For example, in certain applications it is desirable that one end of a connector remain firmly attached to a mating post while the opposite end is easily disengaged from its mating bump. High performance connectors for these certain applications may have a top and a bottom end that are not mechanically equivalent.

In the embodiment shown in FIG. 1A, a double ended tubular connector 110 is held in place by a carrier sheet 132 of 0.05 thick polyimide. The connector 110 is disposed in a hole through carrier sheet 132. Proximal ends of prongs $126_1$ to $126_4$ and prongs $116_1$ to $116_4$ are attached around collar region 120 at the mid-section of connector 110, while distal ends $112_1$ to $112_4$ and distal ends $124_1$ to $124_4$ are free to flex. Connector 110 is held within a via 134 in carrier sheet 132 by $Sn_{95}Ag_5$ solder 136, whereby a top end of connector 110 extends upward perpendicularly from the carrier sheet and a bottom end extends downward perpendicularly from the carrier sheet. Carrier sheet 132 of embodiment 110 is held between two thick copper sheets 142 and 144 by adhesive layers 148 and 146 respectively. The diameter of holes 152 and 154 in copper sheets 142 and 144 respectively are determined by reference to the impedance requirements for connector 110. The diameter of holes 152 and 154 of this embodiment is 1.2 mm. One of skill in the art will know to determine hole diameter in order to achieve a controlled impedance $Z_o=60 \ln(D/d)$, where D is the diameter of holes 152 and 154, and d is the outer diameter of connector 110.

In practical applications, tubular connectors 110 are held in predetermined positions by a carrier sheet. Copper sheets with holes provided for each of the tubular connectors may be added in order to provide shielding and impedance control. In addition to the construction of an embodiment described above, it will be understood by one of ordinary skill in the art that other configurations of a carrier sheet may be used to hold connectors of the invention. By way of example, carrier sheet 132 may comprise; one or more layers of dielectric material such as polyimide, G-10, Ultem® (available from GE Polymers), glass reinforced epoxy, metal reinforced epoxy, liquid crystal polymer materials, and other polymers; and one or more adhesive materials including but not limited to B-staged epoxy, FEP, PFA, Ultem®, acrylics, PTFE, polyethylene, polyamide, and polyamide blends. The adhesive material may be used in sheet form; in layered form such as bondply laminates; in stencil printable paste such as B-staged epoxy available from CTI, Inc. of Baltimore, Md. in dispensable adhesive materials; and other adhesive materials known in the art. The carrier sheet may be further be formed by embossing, punching, drilling, stretching, and mechanical shaping to fit specific applications.

In further variants, carrier sheet 132 may include one or more metal layers that may provide thermal conductivity, ground plane connections, power plane connections, electromagnetic shielding, control of thermal expansion, mechanical rigidity, intra-connector shielding, impedance control of connectors, pressure seals, integral capacitors between metal layers, radiation shielding, means for mounting for discrete components, substrates for additional wiring layers, over-voltage protection grounding, stress relief springs, and other applications known in the art.

FIGS. 2A-2C show a single ended connector 200 according to one or more embodiments of the invention. FIG. 2A shows tubular connector 200 and bulbous terminal 202 before mating therebetween. The bulbous terminal comprises ball 202 attached to substrate 204 by a metallic collar 206, thereby providing a terminal post with a maximum girth in equatorial section at Z=0. Tubular connector 200 comprises a cylindrical metal tube wherein a top end is cut by one or more spiral slots 214 extending downward from the top end of the tube toward a mid section, thereby forming resilient helical prongs 212. Prongs 212 remain attached to a mid section of the tube 228 at a proximal end and are free to flex at a distal end 217. The slots 214 have a variable width wherein the width increases with distance from the upward distal end of the tube along a portion of the slot. Correspondingly, helical prongs 212 have a width as measured circumferentially that decreases with distance along the length of the tube in an axial direction away from the upward distal end of the tube over a portion of the length of the prong. Connector 200 is attached to substrate 216 at a bottom end that is held in plated hole 224 by solder or other attachment means. A thin layer 222 of plated copper connects the tubular connector 200 to via 218 in substrate 216.

As shown in FIG. 2B, ball 202 is mated to connector 200 by urging substrate 204 downward, thereby displacing resilient prongs 212 outwardly away from the axis of connector 200. Prongs 212 contact ball 202 around its circumferential girth at a height where the girth of ball 202 is near a maximum. The prongs 212 urge inwardly upon ball 202 to make positive electrical contact with the ball and to grip the ball and retain it within connector 200. Two or more resilient prongs contact the ball at two or more points around its circumference. The shaped prongs 212 on connector 200 act to generate a force that draws ball 202 into the tubular connector in a direction along the axis of the connector. FIG. 2A shows connector 200 as improved by varying the width of the slots 214 between each prong 212 so as to increase the circumferentially measured width of slot 214 with distance along the axis away from the top distal end of the connector. An increase in the width of each slot 214 with distance from the top end of connector 200, at a region where ball 202 contacts prongs 212, causes prongs 212 to pull ball 202 further into connector 200. The inwardly directed force on ball 202 is due to flexure of prongs 212 caused by a widening of slot 214 with distance away from top end of connector 200. In order to cause an inwardly directed force on ball 202, it is not necessary to emboss prongs of connector 200, to slope the walls of the tube of connector 152, to curl the prongs 154 toward the axis of the tube, or other distortions of the tube. The inner and outer walls of tube of unmated connector 200 are straight and parallel to the axis of the tube. Unmated tubular connector 200 comprises portions of a right regular cylinder, the walls of which are a projection of a loop along the axis of the cylinder. Preferably the loop is a circle and the cylinder is a right circular cylinder. Because connector 200 exerts an inward or compressing force on a mating ball 202 without the need for dimpling, embossing, twisting or otherwise deforming the tubular body of the connector, the connector 200 is easily fabricated by laser cutting a tube with a specific pattern consistent with one or more embodiments of the invention.

Tubular connector 200 provides electrical contact that is resistant to shock and vibration. Resilient prongs 212 grip ball 202 and flex to allow the ball to move in a lateral and in a vertical direction without loosening its grip on ball 202. Mechanical stress, vibration, mechanical shock, warpage, and thermal cycling cause prongs 212 to flex while they retain a grip on ball 202. By way of example FIG. 2C shows a force F on substrate 204, thereby exerting stress on connector 200 and causing resilient prongs 212 to flex and extend in a vertical direction. Whilst prongs 212 distend and flex vertically, they retain a grip on ball 202 that facilitates continuous electrical contact. Further, flexure of prongs 212 significantly reduces rubbing of the ball 202 against prongs 212 of connector 200 due to vibration or other mechanical stress. A reduction of rubbing or "fretting" of ball 202 against surfaces of the prongs 212 of connector 200 improves the reliability and extends the life of the connected assembly shown in FIG. 2C. Fretting as caused by rubbing of one metal surface against another metal surface is well known in the art to produce fine particulate debris at the site of contact, such debris degrading the electrical reliability of an electrical connection between the two metals. Preferably, to reduce fretting, the resilient prongs 212 are formed by two or more slots cut at equal intervals around the circumference of connector 200, where each slot is cut at an angle of between 15° and 75° and more preferably between 20° and 70° with respect to the axis of the connector. Additionally, and more preferably, resilient prongs 212 are formed by slots cut to a length measured along the an imaginary line on the midpoint of the slot that is at least as long as half of the outer circumference of the tube of tubular connector 200.

The force F exerted on ball 202 is shown in FIG. 2D as a function of displacement Z of ball 202 in a direction along the axis of the tube connector. The force profile begins with a compressive force exerted upon ball 202 as it is inserted into the connector 200. As the ball 202 moves along the connector axis in a Z direction, the net force exerted upon ball 202 traverses into tension, thereby holding the ball inward within the connector. The ball is given a small amount of overtravel by inserting it beyond the operating point, and then allowing it to relax to the operating point where it is held in tension. Upon extraction, an additional tensile force is applied to the ball as it moves outward along the Z axis in a negative direction. The connector 200 retains a hold on the ball 202 as it moves outward beyond the initial point of contact, Tensile force F on the ball 202 continues to pull the ball inward into the connector 200, even after the ball is moved outward past the initial point of contact. The helical prongs are extended in the manner of a helical spring until at a critical distance of extension the prongs 212 release the ball 202. Flexure of the helical prongs in the manner of a helical spring allows the ball 202 to move compliantly in a vertical and a horizontal direction without fritting the connector to ball contact.

A double-ended connector of the invention shown in FIG. 3A provides a means for electrically and mechanically connecting a corresponding pair of bulbous terminals such as those of FIGS. 3B to 3E, thereby providing a high performance electrical connection therebetween. Connector 300 is a 2.0 mm long tube of type 304 stainless steel with an inner diameter of 0.44 mm and an outer diameter of 0.55 mm. The tube of connector 300 is cut through along each of a top and a bottom end into resilient helical prongs 306 and 312 respectively of axial length 0.75 mm. The circumferential width of each of prongs 306 and 312 are seen to decrease with distance from the respective end of tube 300. FIG. 3A shows connector 300 held by adhesive 328 in a sheet 320 comprising a top metal layer 314, a bottom metal layer 316 and a dielectric layer 318. In the embodiment of FIG. 3A metal layer 314 of sheet 320 contacts connector 300 thereby connecting the connector to a power distribution circuit or a ground distribution circuit. Alternatively, connector 300 may be connected to top metal layer 314, bottom metal layer 316, or neither. Further, sheet 320 may be a dielectric material with no metal layers or any number of metal layers.

Connector 300 has helical slots 310 that increase in width 302 with axial distance away from the top end of the connector over a portion of the length of the connector. This increase in width 302 acts to produce a downward force on a mating ball such that the ball is pulled downwardly over a range of vertical position for which the width 302 of slot 310 increases with distance from the top end of connector 300. In order that prongs are sufficiently resilient, the angle of slot 310 between prongs 312 is between 15° and 75° or more preferably between 20° and 70° as measured with respect to a plane perpendicular to the axis of the connector. More preferably, each slot 310 between prongs 312 has a length as measured along its midpoint that is at least one half of the circumference of the tube of connector 300, each as measured on the outer diameter of the tube. In addition, the mechanical properties of retention of a bulbous terminal engaged with double ended connector 300 are enhanced by making the width 302 of slot 310 increase with axial distance from top end of connector 300, and likewise making the width 304 of slot 308 increase with axial distance from bottom end of connector 300. The increase of the width 304 of slot 308 with distance from the end of connector 300 acts to produce an inwardly directed force on a mating ball that is exerted by prongs 306 contacting the circumference of the ball as the ball moves along a region of the axis of connector 300. Preferably the ball is mounted to a substrate in a way such that the maximum circumference lies above the surface of the substrate to which the ball is mounted. Although bulbous terminals including but not limited to terminals 330, 340, 350 and 360 of FIG. 4 are preferred, the connector will operate satisfactorily for a wider range of post geometries.

Figure 3B:
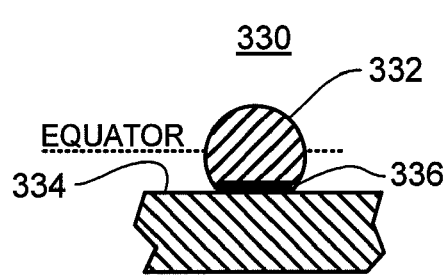
FIGS. 3B-3E are cross-sectional views of various embodiments of bulbous terminals according to the invention.

Bulbous terminals including but not limited to those shown in FIGS. 3B to 3E may be adapted for use with an electrical connector of the invention. Bulbous terminal 330 of FIG. 3B is a solder ball 332 that is soldered to copper pad 336 on printed wiring board 334. Solder bumps are typically spherical sections shaped by surface tension during melting and reflow of the bump. Solder balls may have a core of solid metal such as a nickel-plated copper sphere. Solder bumps 332 of one or more embodiments of the invention preferably have an equator of maximum girth lying in a plane above the surface of the printed wiring board 334.

Figure 3C:
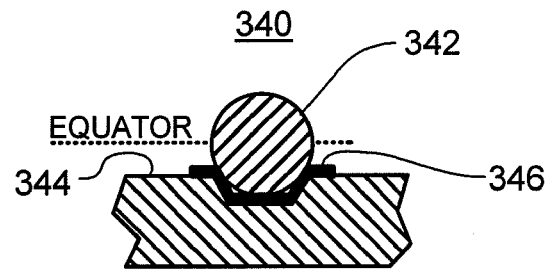

Bulbous terminal 340 of FIG. 3C is a solid metal ball 342 attached to an annular metal ring 346 on printed wiring board 344 by means of thermosonic or thermocompression bonding. Preferably thermosonic bonding is used to attach a nickel/gold plated copper ball 342 to a gold plated annular copper ring 346. Terminal 340 is suited for mating with a high performance electrical connector of the invention for applications such as high temperature operation in which a solder bump is not well suited. Preferably the equator of maximum girth lies above the surface of the printed wiring board 344. Ball 342 is a spherical ball of metal such as without limitation brass, bronze, stainless steel, carbon steel, copper, silver, nickel and alloys thereof. Ball 342 may have a thin metal coating of nickel, Monel, gold, palladium, silver, rhodium, osmium, and alloys thereof to protect the ball against corrosion. Alternatively, ball 342 may be made of a polymer, glass, hollow polymer, or other dielectric material that is coated with a thin metal film. Ball 342 of terminal bump 340 may be provided in various sizes in order to regulate and control the engage/disengage force for mating to an electrical connector of the invention. For example, a large diameter ball is mated to the bottom end of connector 300, while a ball with a smaller diameter is mated to the top end of the connector in order to allow for relatively easy engagement and disengagement of the top ball from connector 300 without disturbing the bottom mated contact.

Figure 3D:
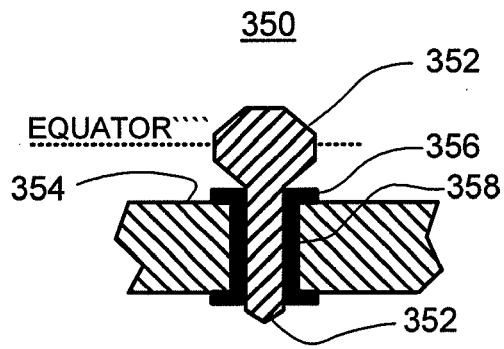

Bulbous terminal 350 of FIG. 3D is a metal post 351 with an axially symmetrical head 352 and an elongated end that is held in a plated through hole 358 in printed wiring board 354. Post 351 is commonly available in the industry as a Swiss machined brass pin. Post head 352 has a chamfered or rounded top edge that facilitates mating with a high performance electrical connector of the invention.

Figure 3E:
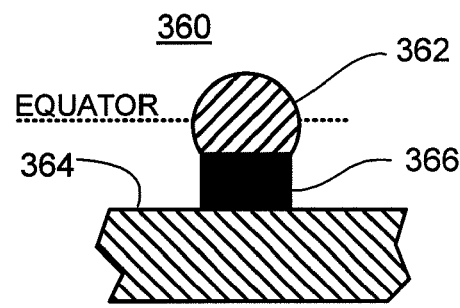

Bulbous terminal 360 of FIG. 3E is a metal ball 362 held above the surface of substrate 364 by collar 366. Such an elevated post 360 may provide augmented mechanical retention properties when mated with connector 300 or other embodiments of this invention. By way of example, terminal 360 may be fabricated by first plating a tall annular ring 366 on substrate 364. Ball 362 may be selected to be a copper ball with thin surface coatings of nickel and gold. Ball 362 is joined to collar 366 by means of thermosonic bonding or thermocompression bonding as is well known in the art of electronic packaging.

Figure 4A:
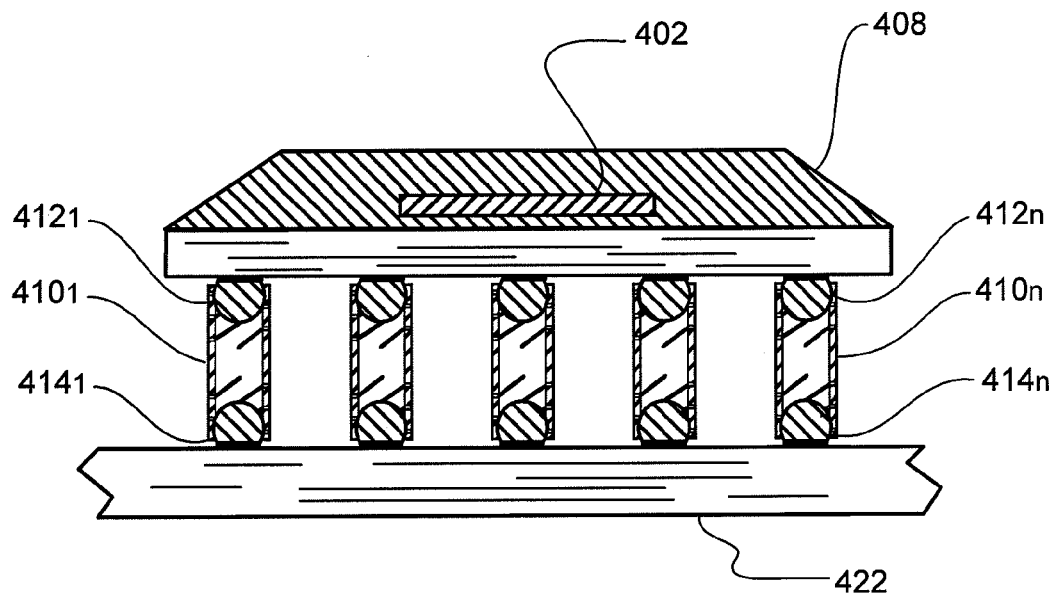
Figure 4B:
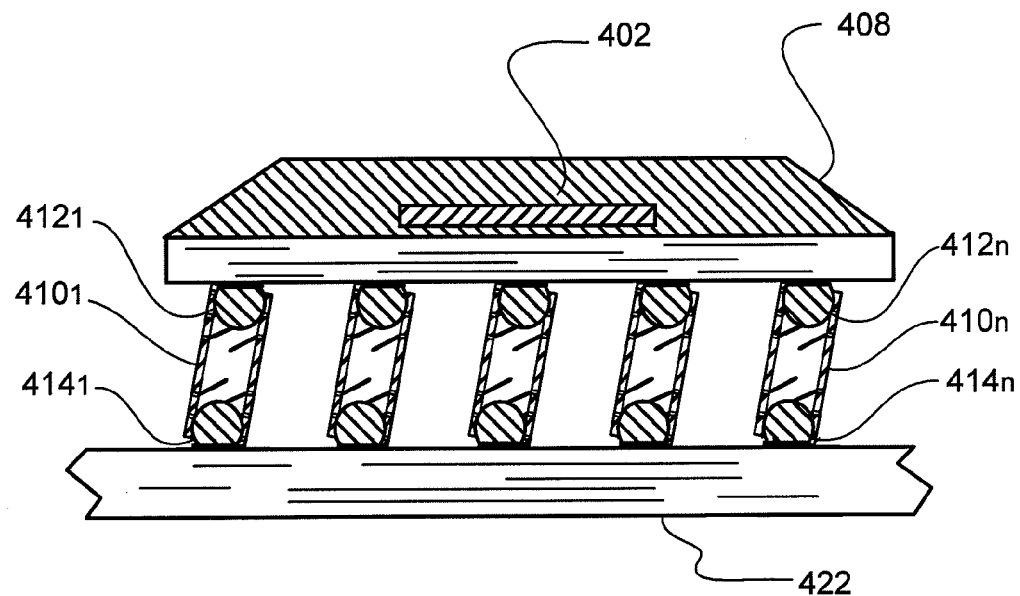

As will be appreciated by one skilled in the art, an array of connectors $410_1$ to $410_n$ may be used to electrically and mechanically connect an electronic device, such as device 408 containing integrated circuit 402, to an electronic system such as circuit board 422 without use of clamps or mechanical constraints as is illustrated in FIGS. 4A and 4B. Connectors $410_1$ to $410_n$ may be configured with upwardly directed prongs such that when mated, bulbous terminals $412_1$ to $412_n$ are captured and urged downwards by a clamping action of upwardly directed prongs around terminals $412_1$ to $412_n$ Likewise, downwardly directed prongs on contactors $410_1$ to $410_n$ capture bulbous terminals $414_1$ to $414_n$ such that terminals $414_1$ to $414_n$ are urged upwards by a clamping action of downwardly directed prongs on terminals $414_1$ to $414_n$. By means of specific design of upwardly directed prongs and downwardly directed prongs, connectors $410_1$ to $410_n$ can be made to draw electronic device 408 toward circuit board 422 upon mating of terminals $414_1$ to $414_n$ with the connectors $410_1$ to $410_n$. By way of example, prongs on terminals $410_1$ to $410_n$ are more preferably designed to make contact around the circumference of the bulbous terminals $414_1$ to $414_n$ at several points that lie on or above the maximum circumference of terminals $414_1$ to $414_n$. By this method, a first electronic device 408 may be mounted to a second electronic device such as substrate 422 without the need for mechanical clamps or constraints. When mated, the connectors $410_1$ to $410_n$ draw the first and second electronic devices together and hold them in place both laterally and vertically. The first electronic device may be demounted by urging device 408 upward with sufficient force to overcome the retaining force holding terminals $414_1$ to $414_n$ within connectors $410_1$ to $410_n$.

In certain applications requiring that connectors $410_1$ to $410_n$ be permanently attached to board 422, connectors $410_1$ to $410_n$ may be permanently affixed to terminals $414_1$ to $414_n$ on substrate 422 by reflowing solder bumps of terminals $414_1$ to $414_n$ thereby wetting and attaching connectors $410_1$ to $410_n$ to terminals $414_1$ to $414_n$ on printed wiring substrate 422. In certain other applications, device 408 may be temporarily connected to the board 422 in order to test the assembled system before permanently connecting device 408 to board 422 by heating the assembly. Solder may be prevented from flowing up the downwardly directed prongs by solder stops, such as oxidized nickel or other solder stops known in the art. One skilled in the art will understand that electronic device 408 and substrate 422 may be used interchangeably in attachment to the array of connectors $410_1$ to $410_n$.

Figure 5:
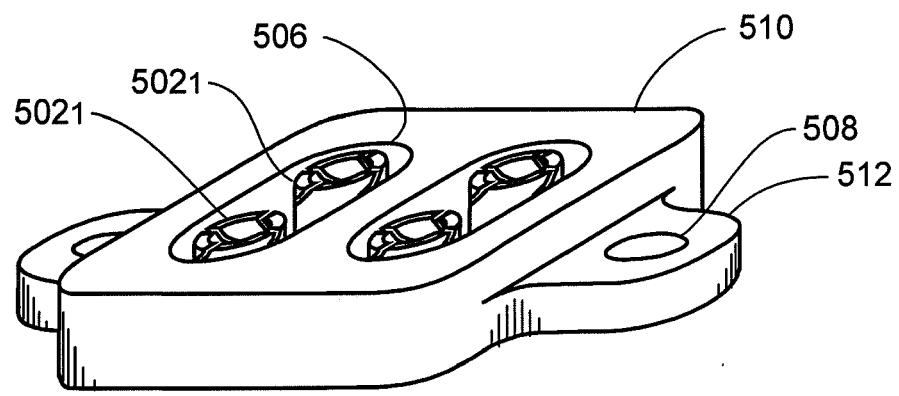
FIG. 5 is a perspective view of a socket incorporating several tubular connectors in a mounting frame.

Connectors $410_1$ to $410_n$ hold mating terminals $412_1$ to $412_n$ device 408 and mating terminals $414_1$ to $414_n$ on substrate 408 together resiliently whereby terminals $412_1$ to $412_n$ may move a small amount in a horizontal direction and a small amount in a vertical direction with respect to terminals $414_1$ to $414_n$ without losing electrical or mechanical connection therebetween. As shown in the embodiment of FIG. 4B, device 408 may be moved with respect to substrate 422 by 0.5 mm in a horizontal direction or by 0.5 mm in a vertical direction without losing contact between terminals $412_1$ to $412_n$ on device 408 and terminals $414_1$ to $414_n$ on substrate 422. The relative motion of device 408 with respect to substrate 422 is accommodated by flexure of resilient upwardly directed prongs on connectors $410_1$ to $410_n$, and by flexure of resilient downwardly directed prongs on connectors $410_1$ to $410_n$. Further relative motion between device 408 and substrate 422 is accommodated by tilt of each of connectors $410_1$ to $410_n$ as allowed by rotation of the connectors $410_1$ to $410_n$ about upper bulbous terminals $412_1$ to $412_n$ and about lower bulbous terminals $414_1$ to $414_n$ By way of example, FIG. 5 illustrates an application of one or more embodiments of the invention in which connectors $502_1$ to $502_n$ are arrayed in housing 510 to form terminal block 500. On a preferred embodiment a pair of connectors $502_1$ and $502_2$ is held in a cavity 506 in housing 510 thereby forming a socket for transmission of differential signals.

Housing 510 may have a metallic surface so as to shield electrically the connectors $502_1$ to $502_n$ against electrical noise in the environment. Connectors $502_1$ to $502_n$ are adapted to mate with a corresponding set of bulbous terminals in a mating terminal block (not shown). Although each of connectors $502_1$ to $502_n$ retains posts mated thereto without need of a clamping force, terminal block 500 is provided with mounting lug 512 and mounting screw hole 508 to provide additional mechanical stability when screws from a mating terminal block are attached through holes 508. It will be understood by one of ordinary skill in the art that any number of connectors may be disposed in each cavity. The connectors $502_1$ to $502_n$ may be single ended or double-ended in accordance with one or more embodiments of the invention. Other connector configurations, shielding methods, mounting methods, clamps, and brackets will be obvious to the practitioner in the field.

Figure 6:
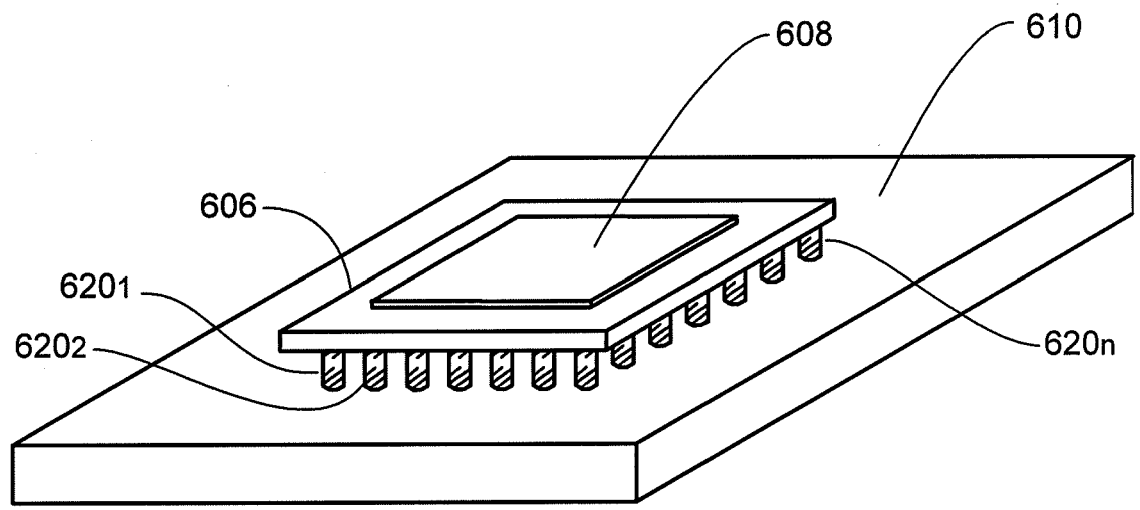
FIG. 6 is a perspective view of a microelectronic device mechanically attached and electrically connected to a printed circuit board by a plurality of tubular connectors of the invention.

Practical use may be made of the invention in mechanically attaching and electrically connecting one electrical device to another. By way of example, FIG. 6 shows assembly 600 comprising electronic device 606 mounted to a printed wiring substrate 610 by means of an array of connectors $620_1$ to $620_n$. Each of connectors $620_1$ to $620_n$ has two or more upwardly oriented prongs that grip a ball (not visible) of the ball grid array (BGA) on the bottom surface of device 606. The array of connectors $620_1$ to $620_n$ retains device 606 in position without the need for mechanical clamping means to maintain contact during periods of normal mechanical stress. Optionally, a clamp may be added to protect the connections to device 606 against incidents of high mechanical stress or to make thermal contact to heat spreader 608 on the top surface of device 606. Resilient prongs on connectors $620_1$ to $620_n$ flex to protect device 606 against vibration and mechanical shock applied to substrate 610.

Connectors $620_1$ to $620_n$ may be double ended wherein upwardly directed prongs thereon grip balls on the BGA of device 606 whilst downwardly directed prongs grip bulbous terminals (not visible in FIG. 6) on substrate 610. The prongs on connectors $620_1$ to $620_n$ may be helically curved according to one or more embodiments of the invention in order to enhance retention properties. Helically curved properties increase the vertical and the lateral resilience of terminals, further reducing the effect of mechanical vibration and shock on the device 606. A further advantage of the invention accrues due to the mating properties of connectors $620_1$ to $620_n$, wherein the force needed to disengage an array of mated connectors $620_1$ to $620_n$ from a BGA is greater than the force need to engage the array of connectors to the BGA. Thereby connectors $620_1$ to $620_n$ made according to one or more embodiments of the invention are able to retain electronic device 606 against disengagement forces that are greater than the force initially used to engage the device. This further advantage enables easy mounting of devices on a substrate with a small force, whilst retaining the device against the effects of larger forces of shock and vibration. Disengagement of device 606 is facilitated by use of mechanical vibration, ultrasonic energy, or the like to reduce the force needed for disengagement of device 606 from substrate 610.

The invention has been explained with reference to specific embodiments. Other embodiments will be apparent to those of ordinary skill in the art. One of ordinary skill in the art would recognize many variations, modifications, and alternatives. It is therefore not intended that this invention be limited, except as indicated by the appended claims.

What is claimed is:

1. A miniature resilient shock-resistant microelectronic connector for joining and electrically connecting two opposing electronic structures having an array of terminals, said connector assembly comprising:
   a plurality of miniature straight-walled electrically conductive metal cylinders, each said hollow cylinder having a first end and a second end, each said end for making electrical and mechanical connection with the terminals of the devices to be linked;
   each said hollow cylinder having at least two angular cuts through its wall, each said angular cut being configured to permit resilient axial and lateral flexure of the hollow cylinder after connection to the terminals of the two opposing structures.

2. The microelectronic connector according to claim 1 wherein length of said cuts is at least half the circumference of the hollow cylinder.

3. The microelectronic connector according to claim 2 wherein said at least two cuts are serpentine.

4. The microelectronic connector according to claim 2 wherein said at least two cuts are helical about said hollow cylinder.

5. The microelectronic connector according to claim 4 wherein angle of said helical cuts is varied along length of said hollow cylinder.

6. The microelectronic connector according to claim 1 wherein said cuts are formed by photolithography.

7. The microelectronic connector according to claim 1 wherein at said cuts are formed by laser cutting.

8. An electronic assembly comprising:
   a first electronic structure having a plurality of first terminals;
   a second electronic structure having a plurality of second terminals disposed to confront the first electronic structure; and
   a plurality of miniature straight-walled electrically conductive hollow metal cylinders, each said hollow cylinder having a first end and a second end, each said first end making electrical and mechanical connection with the first terminals, each said second end making electrical and mechanical connection to the second terminals;
   each said hollow cylinder having at least two angular cuts through its wall, each said angular cut being configured to permit resilient axial and lateral flexure of the hollow cylinders after said first terminals and said second terminals are connected to the hollow cylinders.

9. The electronic assembly according to claim 8, the mechanical connection between the hollow cylinders and at least one of the first terminals and the second terminals being temporary for demounting.

10. The electronic assembly according to claim 8, the mechanical connection between the hollow cylinders and the first terminals and the second terminals being permanent.

11. The electronic assembly according to claim 10, the connection being made permanent by means of solder.

12. The electronic assembly according to claim 8, the electronic structures being selected from the group comprising:
   electronic circuit board, printed wiring substrate; electronic substrate, microelectronic device; integrated circuit.

* * * * *